United States Patent [19]
Elliott et al.

[11] 4,268,951
[45] May 26, 1981

[54] SUBMICRON SEMICONDUCTOR DEVICES

[75] Inventors: Michael T. Elliott, Cypress; Michael R. Splinter, Silverado; Addison B. Jones, Yorba Linda; John P. Reekstin, Orange, all of Calif.

[73] Assignee: Rockwell International Corporation, El Segundo, Calif.

[21] Appl. No.: 959,536

[22] Filed: Nov. 13, 1978

[51] Int. Cl.³ .............................................. B01J 17/00
[52] U.S. Cl. ........................................ 29/571; 29/578; 29/580; 357/59
[58] Field of Search .................... 29/571, 578, 580; 357/59

[56] References Cited
U.S. PATENT DOCUMENTS

| | | | |
|---|---|---|---|
| 3,789,504 | 2/1974 | Jaddam | 29/571 |
| 3,869,786 | 3/1975 | Adam | 29/571 |
| 4,114,255 | 9/1978 | Salsbury | 29/571 |
| 4,160,987 | 7/1979 | Dennard | 29/571 |
| 4,178,674 | 12/1979 | Liu | 357/59 |

*Primary Examiner*—W. C. Tupman
*Attorney, Agent, or Firm*—H. Fredrick Hamann; Daniel R. McGlynn; Wilfred G. Caldwell

[57] ABSTRACT

Semiconductor devices with gate dimensions as small as 0.25 microns square have been fabricated using electron beam lithography and dry processing techniques. In particular, silicon gate, N-channel, metal-oxide-semiconductor (NMOS) field-effect-transistors (FET) have been produced. The devices and the process are especially adapted to bulk silicon based transistors.

16 Claims, 16 Drawing Figures

SUBMICRON SEMICONDUCTOR DEVICES

The invention herein described was made in the course of or under a contract or subcontract thereunder, with the Department of the Navy.

BACKGROUND OF THE INVENTION

1. Field of the Invention

This invention is directed to MOS semiconductor devices, in general, and to such devices which have extraordinarily small dimensions and the methods of making such devices, in particular.

2. Prior Art

There are many known techniques and processes for making semiconductor devices of many and varied types. Many of these devices which are fabricated are of the so-called "N-channel" variety. Many of the known processes include E-beam lithography, X-ray lithography, dry processing techniques or wet processing techniques. The types of processing which are utilized are a function of the device to be fabricated and the size thereof. For example, dry processing techniques permit more vertically arranged device edges and the like so that dimensions can be reduced.

Semiconductor devices having dimensions on the order of 1 to 2 microns are known in the art. However, in order to produce very large scale integrated (VLSI) devices and techniques, the existing technologies have been studied extensively to establish methods of reducing the size of the MOS transistor. In theory, reducing the size of an MOS transistor is straightforward. However, this size reduction cannot easily be accomplished inasmuch as it requires maintaining the same relative characteristics and threshold voltage after scaling so that the same circuit design can serve for both small and large geometries. While this reduction in size is, theoretically, straight-forward, many factors must be taken into consideration. Moreover, theoretical predictions by computer simulation, for short channel, narrow gate width devices is not as easily converted into actual practice as initially thought. Many process and device parameters must be scaled down concurrently to produce a useful device and to avoid undesirable side effects. Thus, it is essential that the appropriate combination of techniques, most of which are standard or known in the art, be established in order to optimize the processing techniques and, thus, minimize the size of the various semiconductor devices.

PRIOR ART STATEMENT

The most pertinent prior art known to applicants is listed herewith. "Fabrication of a miniature 8K-bit memory chip using electron-beam exposure", H. N. Ye et al, Journal, Vacuum Science Technologies, Vol. 12. No. 6, November/December, 1975, pages 1297 through 1300.

U.S. Pat. No. 3,899,363, "Method and Device for Reducing Sidewall Conduction in Recessed Oxide FET Arrays", Dennard et al.

SUMMARY OF THE INVENTION

Semiconductor devices and a method of making same are described. The devices have submicron (e.g. quarter micron square—i.e. 0.25 $\mu$m×0.25 $\mu$m) gate dimensions although larger dimensions are obtainable, also. The devices are fabricated on silicon substrates using electron beam microfabrication and dry processing (etching). Both enhancement mode and depletion mode transistors can be fabricated. An isoplanar process consisting of a maximum of eight masking operations and a maximum of five ion-implantations is described. Positibe electron-resist is used together with lift-off techniques and a unique combination of dry etching steps to achieve high resolution requirements (less than 0.25 microns) as well as large aspect ratios. With the process involved herein, the previously considered lower limit of half micron devices has been overcome.

DESCRIPTION OF THE DRAWINGS

The reference numerals in FIGS. 3A–3M refer to different elements than the same numerals in FIGS. 1 and 2.

DESCRIPTION OF A PREFERRED EMBODIMENT

Figure 1:
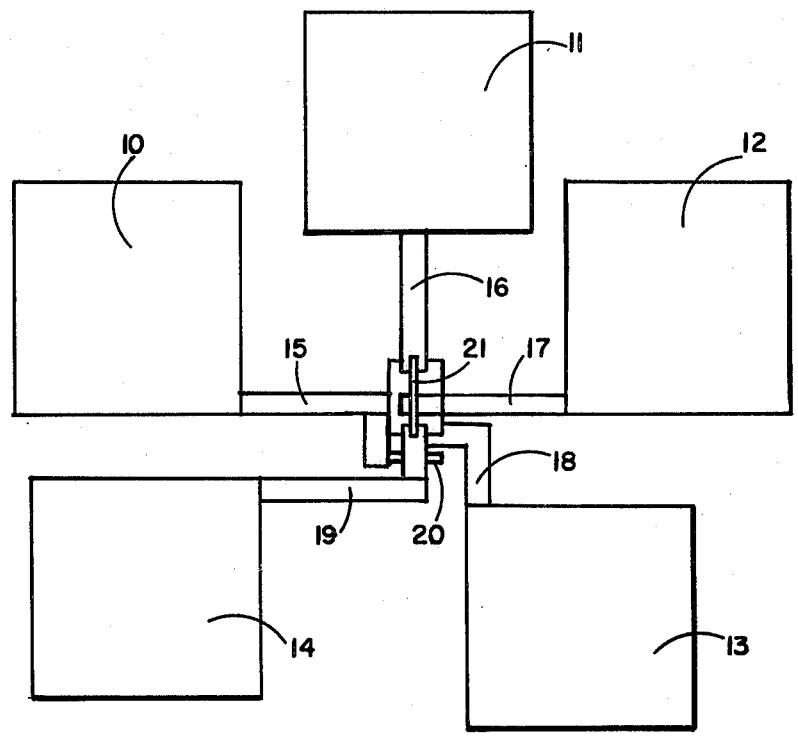
FIG. 1 is an illustrative layout of one circuit formed using a device and method of the instant invention.

Referring now to FIG. 1, there is shown an illustrative arrangement of an inverter pad layout display which was formed in accordance with the instant invention. This inverter pad arrangement was prepared as a test vehicle for the invention. In particular, in the display shown in FIG. 1, all of the devices were designed to fit within the two millimeter squared EBMF working area. The bonding pads 10, 11, 12, 13 and 14, are all two mils on a side. A two-level alignment tolerance of 0.5 $\mu$m was included in both the vertical and horizontal directions to assure overlap of all the patterns produced by the EBMF device. The minimum feature size was 0.25 $\mu$m based upon a limit which was believed to be achievable using the PMMA and the liftoff process. The basic inverter network consists of a load transistor connected in series with a driver transistor. The pads are connected via extension lines 15, 16, 17, 18 and 19, respectively, to the inverter 200. The pads are used for bonding of external circuitry thereto while the extension lines permit interconnection of the pads to inverter 200.

Figure 2:
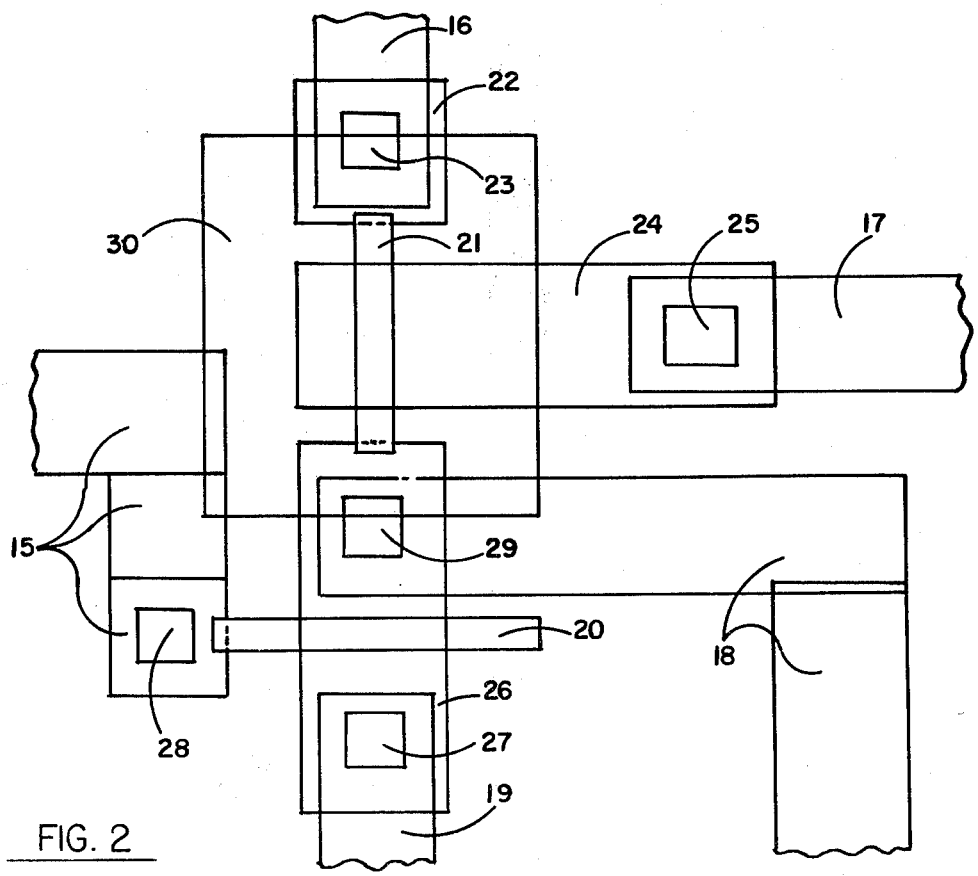
FIG. 2 is a more detailed illustration of a portion of the device shown in FIG. 1.

Referring now to FIG. 2, there is shown a detailed illustration of inverter 200 formed in accordance with the instant invention. The illustration in FIG. 2 is more detailed and shows the respective relative dimensions of the various components of the transistors formed in accordance with the instant invention. Components in FIG. 2 which are similar to components of FIG. 1 bear similar reference numerals. Thus, metal input conductor 15 is shown connected to polysilicon contact area 28. Therefore, conductor 15 is electrically connected with the polysilicon gate 20 of driver transistor 210 which extends across the semiconductor region 26. The gate 20 of driver transistor 210 is interposed between the N+ regions 27 and 29. N+ region 27 provides the contact area between the N+ doped silicon semiconductor region and the metal strip 19 which is connected to the source for the driver transistor and which is typically connected to ground. Likewise, contact 29 provides the contact between the silicon and the metal output conductor which provides the output or drain for the driver transistor. The semiconductor region 26 represents the driver transistor. Similarly, metal conductor 17 which is typically connected to the source $V_{GG}$ is connected to a polysilicon contact area 25 which is connected to the gate 24 of the load transistor 220. The gate portion (the intersection of 24 and 21) of the load transistor 220 is connected between metal conductor 16 and metal conductor 18 and is disposed adjacent metal conductor 17. Again, an N+ silicon region 23 forms a contact area between metal conductor strips 16 which is typically associated with the source $V_{DD}$ and contact area 23. An implanted region 30 is also shown to suggest the location of this device. The polysilicon contact 25 is provided between the metal conductor strip 17 and polysilicon gate conductor 24 which forms the gate of the load transistor 220.

The device shown in FIG. 2 is an illustration of a 1.0 micron inverter (i.e., the gate 20 has an "L" length dimension of 1 micron) while the metal extension lines 17 through 19 are on the order of five microns wide. The dimensions shown are substantially to scale on a relative basis and show a device as actually fabricated. The basic inverter circuit consisted of a load transistor 220 connected in series to a driver transistor 210. The source of the load device is common to the drain of the driver transistor as well as being the output of the inverter. Supply voltage ($V_{DD}$) was connected to the drain of the load transistor. The source of the driver transistor is connected to ground. The switching characteristics of the inverter depend on the channel length of the driver transistor, the current handling capability of the load transistor, and the capacitances in the circuit. Width-to-length ratios of 5 were chosen as typical of an inverter driver transistor. The width-to-length ratio for the enhancement load transistor was 0.2 which corresponds to interchanging the channel length and the channel width. Ratio logic, required the ratio of the load-to-driver-resistance to be high, typically on the order of 10:1. Hence, the following design parameters were used for the largest inverter shown in FIG. 2: $W_{driver} = 5$ μm, $L_{driver} = 1$ μm, $V_{DD} = 3.5$ volts, $V_T = 1.0$ volts (of transistor 210) and $t_{ox}^{thin} = 240$ Å of transistors 210 and 220). Similar parameters are associated with $L = 0.25$ μm device.

This set of characteristics produces resistance values of $R_{on}$ approximately 5 K for the driver transistor and $R_{load}$ approximately 100 K for the load transistor. The voltage amplification factor in the linear regions is approximately $A_V = -5$ which was considered more than sufficient to maintain oscillation in a ring oscillator formed of devices as described herein.

Referring now to FIGS. 3A through M, there are shown, diagrammatically, several of the steps in the process for making devices having N-channel silicon gates of quarter-micron (or less) dimensions using the E-beam microfabricator (EBMF).

Figure 3A:
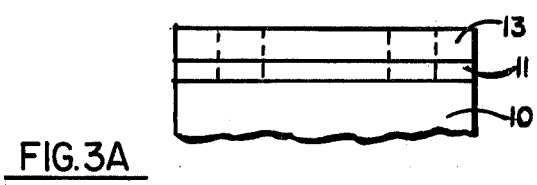
FIGS. 3A through M depict the process of forming devices in accordance with the instant invention.

As shown in FIG. 3A, the device and the process begin with a P-type bulk, monocrystalline silicon wafer 10 having a relatively low doping level, for example, $N_A < 10^{15}/cm^3$. Typically, the dopant is Boron. The silicon wafer is of a two ohm-centimeter variety and has the <100> surface exposed. The wafer is initially cleaned of any organic residue by insertion into a bath comprising $H_2O_2 \cdot NH_4$. Then a typical cleaning operation is utilized to remove the residue of the organic cleaning operation. Of course, any suitable cleaning operation can be utilized in order to provide wafers of appropriate cleanliness and surface conditions.

Thereafter, layer 11 of silicon dioxide ($SiO_2$) is grown by placing wafer 10 in a steam atmosphere at approximately 875° C. for twenty minutes. This operation produces a silicon dioxide layer of approximately 400 angstroms thickness. The wafer with the silicon dioxide layer is also baked for twenty minutes in a nitrogen ($N_2$) atmosphere in order to anneal and otherwise complete the process of growing the silicon dioxide layer.

Then, a registration resist layer 13 of the PMMA type is applied to silicon dioxide layer 11 on wafer 10. In the particular process involved, the resist was applied by a spin process with a speed of approximately 2,000 rpm until a thickness of approximately 4500 angstroms was achieved. The resist is treated in a standard manner such as baking at approximately 60° C. for half an hour and developing for two minutes in a 3:1 solution of IPA. MIBK which is relatively well known in the art. After this processing, the PMMA layer defines a registration mask pattern through which the silicon dioxide layer is etched in BHF for approximately 30 seconds. Thus, the silicon dioxide layer is etched in accordance with the pattern established by the resist mask. The registration resist mask is then stripped in caros acid which is known in the art to include $H_2O_2$.

Thereafter, the wafer is precleaned with hydrazine etchant and dipped in additional BHF to essentially clean the surface of the silicon dioxide layer and to remove any remnants of the reist mask. Thereafter, another hydrazine etch is conducted for approximately $4\frac{1}{2}$ minutes to etch somewhat into the silicon to assure that the wafer is clean.

Figure 3B:
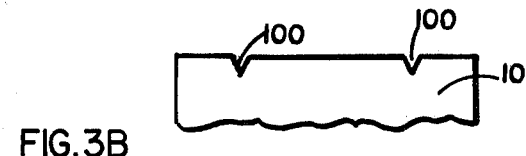

Subsequently, the wafer is rinsed in deionized (DI) water for five minutes to remove the remnants of the hydrazine etch. Thereafter, all of the oxide ($SiO_2$) is stripped in a 5:1 BHF solution for the appropriate amount of time to remove all of this oxide. At this point, alignment markers 100 have been produced in the silicon wafer as shown in FIG. 3B. These markers are in the form of inverted pyramids and are very useful in furthe processing techniques to establish precise alignment procedures in handling the wafers. It may be considered that the steps which have been discussed until now are not essential to the actual invention. However, in order to describe the best mode of operation, and the method which is very useful in performing the process of this invention, the preliminary steps noted above are included herein.

Continuing along with the process, after all of the oxide has been stripped in the BHF solution, the wafers are cleaned using any of the known cleaning methods which are appropriate—some of which are noted above.

Figure 3C:

Referring to FIG. 3C, a layer 12 of approximately 200 angstroms of silicon dioxide is grown on the surface of wafer 10 by inserting the wafer (with or without the alignment masks noted above) into a steam atmosphere at approximately 875° C. for ten minutes. Thereafter, a layer 14 of silicon nitride ($Si_3N_4$) is deposited in a thickness of approximately 2200 angstroms on silicon dioxide layer 12. Typically, the silicon nitride layer is deposited using LPCVD (low pressure chemical vapor deposition) at a temperature of 800° C. Then, layer 16 of oxynitride (silicon dioxide with a small percentage of nitrogen in the film), approximately 50 angstroms thick, is grown on the silicon nitride layer by placing the wafer in a steam atmosphere of approximately 1,000° C. for about ten minutes. Again, the wafer is baked in nitrogen at about 1,000° C. for ten minutes to cure silicon dioxide layer 16.

At this point, PMMA resist layer 18 is applied to silicon dioxide layer 16 in suitable fashion. Typically, the resist is applied using a spin process such as noted above. The resist is then exposed, developed and otherwise treated to produce an active area mask on the silicon dioxide layer. Thereafter, portions of the resist mask are stripped with a plasma stripping process which uses relatively low power, for example, ten watts at 1.5 TORR in an oxygen atmosphere for approximately four minutes. This plasma strip process is used to clean up the resist surface and to remove any extraneous resist materials left in defined areas during the prior processing. Thus, a patterned layer 18 is produced.

Figure 3D:
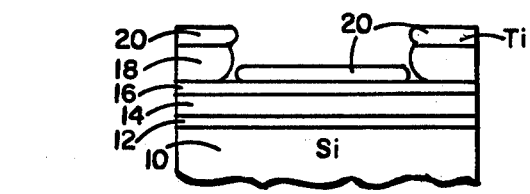

Referring now to FIG. 3D, there is shown titanium layer 20 which is deposited onto the wafer with the patterned E-beam resist mask 18 thereon. The titanium, which may be an alloy comprising approximately 4% aluminum, 6% vanadium and the remainder titanium, is evaporated at approximately 5 angstroms per minute using a system having normal incidence and no rotation. The titanium layer is deposited to a thickness of 500 to 1500 angstroms but with a preferred thickness of approximately 1,000 angstroms being utilized. As is relatively clear from FIG. 3D, because of the undercutting of PMMA resist mask 18, titanium layer 20 forms a reverse mask which defines a layer on the wafer (including the pattern resist mask) which is not continuous at the sidewalls of the channels formed in the resist.

Figure 3E:
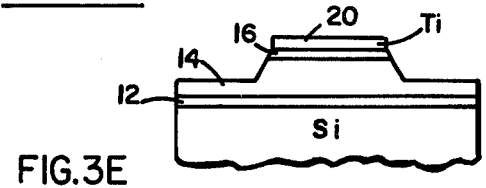

Next, the wafer is placed in an acetone bath for approximately one hour. This activity dissolves the PMMA mask and, thereby, removes both resist mask 18 and the portion of titanium layer 20 which is disposed thereon. The wafer is then subjected to an ultrasonic cleaning for ten to thirty seconds depending upon the time required to clean the surface of any residue left after the acetone liftoff process. The wafer is then placed in a suitable ion milling apparatus which is pumped down to $1 \times 10^{-6}$ TORR in preparation for ion milling. Pressure during ion milling is approximately $1 \times 10^{-4}$ argon and $1.5 \times 10^{-5}$ oxygen. The voltage applied to the system is approximately 600 volts and the beam current is about 1 MA/cm$^2$. The apparatus is operated for approximately 12 minutes wherein approximately 4100 angstroms of silicon dioxide (layer 18) and silicon nitride (layer 14) are removed such that the device shown in FIG. 3E is produced. That is, the argon ion milling in a twenty percent partial pressure of $O_2$ is employed to etch into the silicon to a depth of approximately 2500 angstroms. The milling ratio of silicon to titanium is approximately 7:1 at a removal rate of 350 angstroms per minute of silicon under these conditions. Subsequently, all of the titanium is removed by placing the wafer in a 6:1:1 solution of $H_2O:H_2O_2:HCl$ at 80° C.

Figure 3F:
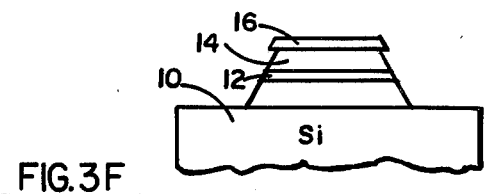
Figure 3G:
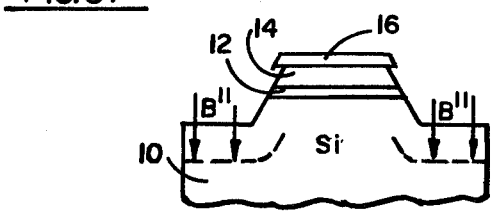
Figure 3H:
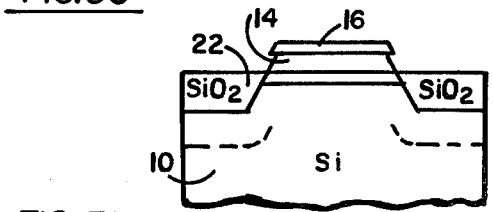
Figure 3I:
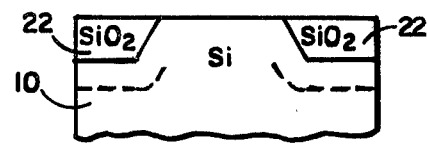

The wafer, such as is shown in FIG. 3F, is then subjected to standard cleaning procedures to remove any of the residual debris which is created by the preceding steps. At this time, a field implant of $1 \times 10^{12}$ atoms/cm$^2$ of $B^{11}$ at 65 KEV is provided in order to provide a channel stop. Silicon nitride layer 14 functions as an implant mask. Consequently, as shown in FIG. 3G, an ion implanted wafer is formed. This implant operation, produces a maximum concentration at approximately 2500 angstroms below the surface of the silicon wafer, per se.

The wafer was again cleaned and then placed into a steam atmosphere for thirty minutes at 875° C. in order to grow additional silicon dioxide. The silicon dioxide is cured by a 10 minute bake in nitrogen. Subsequently, a field oxide 22 is grown by placing the wafer in a steam atmosphere for approximately 6 minutes and finally in a dry $N_2$ atmosphere for approximately 30 minutes. This step produces field oxide 22 of approximately 6,000 angstroms in the recessed silicon areas shown in FIG. 3H. That is, nitride layer 14 functions, in this instance, as an oxide growth mask.

The wafer is then dipped in a 5:1 BHF solution for approximately 15 seconds. Next, the wafer was placed into a hot (180° C.) phosphoric bath for approximately 50 to 100 minutes to strip nitride layer 14. The wafer is then rinsed for approximately 5 minutes in deionized water. Thereafter, approximately 200 angstroms of silicon dioxide is removed in a BHF solution with an approximately 30 second processing step. This step basically activates the surface of the silicon dioxide for further activities hereinafter.

Thereafter, the wafer is placed in a steam atmosphere at approximately 1,000° C. for approximately 20 minutes in order to grow a 1200 angstrom silicon dioxide layer 24. The silicon dioxide layer is then cured in a nitrogen atmosphere for approximately 20 minutes to form the device shown in FIG. 3I to produce the device illustrated in FIG. 3J.

Thereafter, the oxide is again stripped or removed using a BHF bath. The wafers are then cleaned in accordance with standard techniques in order to provide for the application of the gate oxide. The gate oxide is regrown to produce the device shown in FIG. 3J by placing the cleaned wafer in an atmosphere of dry oxygen for approximately 2.0 hours. The atmosphere is formed by applying $O_2$ and HCl in appropriate measures. Typically, the HCl has a rate of 1.1 and the $O_2$ has a rate 10 in the same flowmeter. The gate oxide is grown to a thickness of approximately 240 angstroms. The gate oxide is then cured by being placed in an atmosphere of dry $N_2$ at 875° C. Thus, the structure shown in FIG. 3J is provided and a gate oxide established.

Figure 3J:
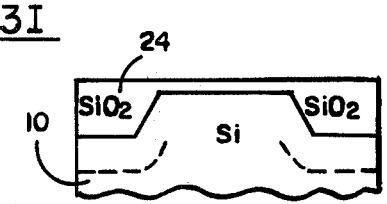
Figure 3K:
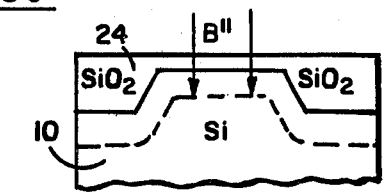

Thereafter, a suitable electron resist (such as PMMA noted above) is deployed on the surface of the composite shown in FIG. 3J and appropriately treated to form a pattern thereon. After the pattern is developed, phosphorus is selectively implanted into the structure using 60 KEV and a 7° angle to provide N-type areas in the structure. The dose used in this ion implantation is $2 \times 10^{12}$. Thus, the depletion-type devices are established in the composite. Subsequently, the electron resist is stripped using a standard or typical plasma stripper, a new electron resist applied, developed and the composite is then subjected to an ion implantation of boron and a dose of $2 \times 10^{11}$, with either 80 or 30 KEV. The wafers were then cleaned and annealed by exposing the wafer to an atmosphere of $O_2$+HCl for ten minutes at 875° C. This 20 minute anneal effectively activated the field implant. These implants provide for depletion or enhancement devices to be fabricated as suggested by FIG. 3K.

Figure 3L:
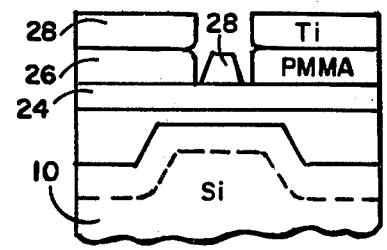

Now the substrate preparation has been substantially completed and actual device fabrication is undertaken. The device fabrication is shown in FIG. 3L wherein an undoped polysilicon layer 230 of approximately 2,000 angstroms thickness is deposited on the composite shown in FIG. 3K. An E-beam resist layer 26 is applied and exposed to form a gate pattern on the polysilicon layer. The deposit, with the resist (PMMA) layer 26 thereon, is placed in a plasma stripper and subjected to an $O_2$ plasma with applied power of 10 watts and at a pressure of 1.5 TORR for four minutes. This operation now establishes the gate pattern on the polysilicon layer of the composite. Thereafter, aluminum-titanium layer 28 which forms the gate of either the drive or the load transit, about 1500 angstroms thick is deposited on the masked composite (layer 230). After the aluminum titanium alloy layer is established, a lift off procedure is utilized by placing the composite in an acetone bath for approximately 1 hour wherein PMMA mask 26 is dissolved and the alloy layer thereon is also removed. An ultrasonic cleaning for approximately 15 seconds is utilized to clean the residue from the composite.

Figure 3M:
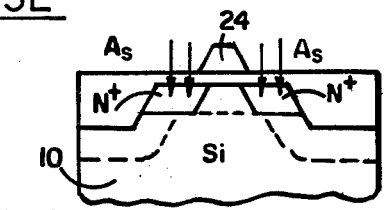

Thereafter, as shown in FIG. 3M, the composite is ion milled to a depth of 1200 angstroms with appropriate parameters such as a voltage of 600 volts, $O_2$ pressure of $1.5 \times 10^{-5}$ TORR, and argon pressure of about $1 \times 10^{-4}$ TORR to effectively remove the polysilicon which is not masked by the titanium aluminum alloy. Thereafter, a suitable plasma etch is used to remove and clear the remaining polysilicon composite. When this step is completed, the composite is ion implanted with arsenic having a dose of $1 \times 10^{15}$ cm$^{-2}$ and an energy of 120 KEV at an angle of approximately 7°. As shown in FIG. 3M, N+ areas or regions are then formed in the silicon of the composite on opposite sides of the channel which is defined by the polysilicon/titanium aluminum alloy mask arrangement.

Figure 3N:
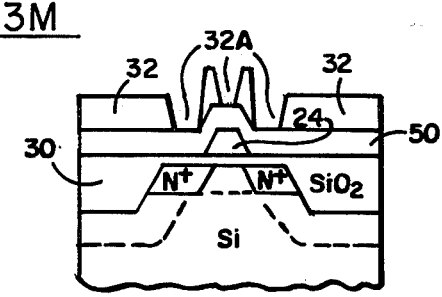
Figure 3O:
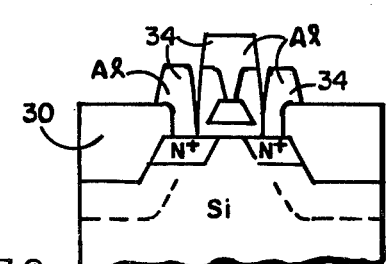

As shown in FIG. 3N, the wafer is then cleaned and a layer of approximately 1,000 angstroms of undoped silox 30 is deposited on the composite including the portion of the polysilicon mask 230 which remains over the gate channel. The wafers are again scrubbed and cleaned using standard techniques. The cleaned wafers are then dried at approximately 875° C. in an atmosphere of $N_2$ for approximately 10 minutes. Thereafter, a layer 50 of phosphorous doped silox, i.e. phosphosilicate glass or PSG, approximately 2,000 angstroms thickness is deposited on the composite. The silox is phosphorous doped by approximately 7% by weight. At this point a doped silox layer can be applied and reflowed in order to provide smooth surface. The wafers are again scrubbed and cleaned using typical techniques. An electron resist mask 32, approximately 9000 angstroms thick, is applied by spinning techniques such as an 1,000 RPM or the like. Contact openings 32A are then ion milled through the silox for a distance of approximately 3300 angstroms using appropriate parameters.

At this point, the contacts to the underlying regions are checked and the resist is stripped in a hydrogen peroxide-sulfuric acid solution. If necessary, an ion implantation of phosphorous at a dose of $2 \times 10^{15}$ cm$^{-2}$ and 30 KEV is provided in order to establish good contact with the composite regions. The wafers are then cleaned again in accordance with usual procedures and subjected to an atmosphere of nitrogen ($N_2$) and argon ($Ar_2$) for twenty minutes at approximately 1,000° C. to anneal and drive the implant. Next, a double thickness layer of resist is applied and patterned to provide the metal mask. When this operation is completed, PSG etch number is applied for approximately 5 seconds to clear the contact holes and undercut the resist layer slightly in order to provide for good lift off in subsequent operations.

Thereafter, a layer 34 of aluminum silicon is deposited to a thickness of 7,000 angstroms by E-beam evaporation with normal incidence. The resist layer previously applied is now lifted off in an acetone solution wherein the unwanted aluminum silicon layer is also removed.

The remaining composite is annealed in a forming gas at approximately 450° C. for fifteen minutes to complete the annealing of the device.

Thereafter, a passivation layer, approximately 3,000 angstroms of 2% phosphorous-doped silox is applied over the composite. The resist of the overcoat mask is applied and exposed in the appropriate pattern to establish the areas or bonding pads. Appropriate holes are etched using BHF. Thereafter, an aluminum layer of approximately 4,000 angstroms thickness is deposited using a typical procedure. Thus, the bonding pads are now provided. Finally, resist layer is removed or lifted off in "microstrip" solvent and the apparatus is effectively completed.

It should be noted, that the phosphorous implant noted earlier relative to FIG. 3K is an optional operation for establishing depletion mode type devices in the overall apparatus and composite. The optional step may be omitted if desired.

Thus, there has been shown and described a technique and process for making submicron semiconductor devices. It is noted that many of the steps involved herein are steps which are known in the art. In point of fact, the significant contribution herein involved is the ability to form submicron devices utilizing primarily state of the art techniques. However, the process permits the fabrication of the submicron semiconductor devices as is highly desirable without using exotic, unknown and untried techniques or steps. Thus, the yield factor, the cost factor and other similar concerns are substantially minimized. In addition, it should be understood that many of the parameters which have been recited are illustrative only. These parameters are not intended to be limitative of the invention. Consequently, those skilled in the art may be able to modify these parameters slightly in order to effect somewhat different maximized results for the specific application. However, the scope of the invention is defined only by the claims appended hereto. Any modifications to the invention which fall within the description hereof are intended to be included therein as well.

Thus, there is described a preferred embodiment of the invention, what is claimed is:

1. A method of fabricating semiconductor devices having dimensions less than one micron, comprising the steps of masking a suitable semiconductor substrate with etchant resist mask, etching portions of the substrate in accordance with the pattern defined by the etchant resist mask, implanting selected dopants into said substrate after masking, growing an insulating layer onto the etched and implanted substrate, further implanting the substrate in the region under said mask after removing the mask and after said growing step such that said substrate has dopants implanted therein at different depths, growing a polycrystalline layer on said substrate after said further implanting step, masking and etching said polycrystalline layer to leave a portion over said region, additionally implanting said substrate using said polycrystalline portion as a mask to define self-aligned portions of a semiconductor device, masking said additionally implanted substrate to define metallization patterns, and metallizing said substrate to provide electrical contacts to selected portions thereof.

2. The method recited in claim 1 including the further steps of, implanting into said additionally implanted substrate an additional dopant to prevent junction spike-through.

3. The method recited in claim 1 wherein said etchant resist mask includes a layer of silicon nitride and a layer of silicon oxide.

4. The method recited in claim 3 wherein said etchant mask includes a layer of titanium.

5. The method recited in claim 4 wherein said titanium layer defines an etchant mask for said silicon nitride layer which, in turn, defines an etchant mask for said substrate.

6. The method recited in claim 1 wherein the dopant utilized in said implanting and said further implanting steps is Boron.

7. The method recited in claim 1 including a depletion mode implanting step wherein additional dopant is implanted into said substrate.

8. The method recited in claim 7 wherein said additional dopant is Phosphorus.

9. The method recited in claim 7 including, masking said substrate to define the areas wherein depletion mode devices are to be provided.

10. The method recited in claim 3 wherein said silicon nitride layer is deposited by CVD techniques.

11. The method recited in claim 11 wherein said etching steps comprise an ion milling procedure.

12. The method recited in claim 1 wherein said substrate comprises a wafer of $<100>$, 2 ohm-cm silicon.

13. The method recited in claim 1 wherein said implanting step comprises an ion implantation procedure for forming a channel stop and said etchant resist mask operates as a mask for said ion implantation procedure.

14. The method recited in claim 1 wherein said polycrystalline material comprises polysilicon which is deposited over a gate oxide.

15. The method recited in claim 1 including, annealing said substrate after said additional implanting step.

16. The method recited in claim 1 including providing bonding pads during said metallization step, and finally annealing the device formed.

* * * * *

UNITED STATES PATENT AND TRADEMARK OFFICE
CERTIFICATE OF CORRECTION

PATENT NO. : 4,268,951

DATED : May 26, 1981

INVENTOR(S) : Michael T. Elliott et al.

It is certified that error appears in the above—identified patent and that said Letters Patent is hereby corrected as shown below:

Column 1, line 54, "Ye" should read -- Yu --.

Column 7, line 61, delete "number".

Column 10, line 7, "claim 11" should read -- claim 1 --.

Signed and Sealed this

Twenty-second Day of December 1981

[SEAL]

Attest:

GERALD J. MOSSINGHOFF

Attesting Officer    Commissioner of Patents and Trademarks